(12) United States Patent
Cloutier et al.

(10) Patent No.: US 8,531,217 B2
(45) Date of Patent: Sep. 10, 2013

(54) FRACTIONAL-N FREQUENCY SYNTHESIZER HAVING REDUCED FRACTIONAL SWITCHING NOISE

(75) Inventors: Mark M. Cloutier, Gatineau (CA); Kashif Sheikh, Nepean (CA)

(73) Assignee: Hittite Microwave Corporation, Chelmsford, MA (US)

( * ) Notice: Subject to any disclaimer, the term of this patent is extended or adjusted under 35 U.S.C. 154(b) by 0 days.

(21) Appl. No.: 12/798,685

(22) Filed: Apr. 9, 2010

(65) Prior Publication Data

US 2010/0264965 A1   Oct. 21, 2010

Related U.S. Application Data

(60) Provisional application No. 61/212,398, filed on Apr. 10, 2009.

(51) Int. Cl.
    *H03L 7/06* (2006.01)
(52) U.S. Cl.
    USPC ............ 327/156; 327/146; 327/155; 327/157
(58) Field of Classification Search
    USPC ................ 327/141, 144–163; 375/373–376; 331/1/A, 15–17
    See application file for complete search history.

(56) References Cited

U.S. PATENT DOCUMENTS

| | | | |
|---|---|---|---|
| 4,204,174 A | 5/1980 | King | |
| 4,965,531 A * | 10/1990 | Riley | ............................ 331/1 A |
| 5,021,754 A | 6/1991 | Shepherd et al. | |
| 5,055,800 A | 10/1991 | Black et al. | |
| 5,847,615 A | 12/1998 | Roth | |
| 5,920,233 A | 7/1999 | Denny | |
| 6,308,049 B1 | 10/2001 | Bellaouar et al. | |
| 6,317,476 B1 | 11/2001 | Oishi et al. | |
| 6,420,916 B1 * | 7/2002 | Freeman | ........................ 327/156 |
| 6,509,800 B2 | 1/2003 | Stockton | |
| 6,515,525 B2 | 2/2003 | Hasegawa | |
| 6,553,089 B2 | 4/2003 | Huh et al. | |
| 6,600,378 B1 | 7/2003 | Patana | |
| 6,603,360 B2 | 8/2003 | Kim et al. | |

(Continued)

OTHER PUBLICATIONS

International Searching Authority, International Search Report and Written Opinion for International Application No. PCT/US2010/001066, 8 pages (unnumbered).

(Continued)

*Primary Examiner* — Lincoln Donovan
*Assistant Examiner* — Brandon S Cole
(74) *Attorney, Agent, or Firm* — Iandiorio Teska & Coleman, LLP

(57) ABSTRACT

A fractional-N frequency synthesizer having reduced fractional switching noise and spurious signals is provided. The synthesizer includes a voltage controlled oscillator for providing an output signal. A fractional-N divider is responsive to the voltage controlled oscillator for providing a divided output signal having fractional switching noise. A band pass filter is responsive to the fractional-N divider for reducing the fractional switching noise and non-linearities that result in spurious signals. A phase detector is responsive to a reference signal and the band pass filter for providing a control signal representative of the phase difference between the reference signal and the signal from the band pass filter. A loop filter is responsive to the phase detector for filtering the control signal to control the voltage controlled oscillator, the output of the loop filter having reduced fractional switching noise and spurious signals.

28 Claims, 8 Drawing Sheets

(56) References Cited

U.S. PATENT DOCUMENTS

| | | |
|---|---|---|
| 6,636,086 B2 | 10/2003 | Mar |
| 6,642,800 B2 | 11/2003 | Drapkin et al. |
| 6,693,468 B2 | 2/2004 | Humphreys et al. |
| 6,707,855 B2 | 3/2004 | Patana |
| 6,825,729 B2 | 11/2004 | Splett |
| 6,873,231 B2 | 3/2005 | Germain et al. |
| 6,914,935 B2 | 7/2005 | Eklof |
| 7,075,384 B2 | 7/2006 | Tamura |
| 2001/0050994 A1 | 12/2001 | Bakx |
| 2002/0114386 A1 | 8/2002 | Eklof |
| 2004/0012423 A1* | 1/2004 | Maeda .................... 327/156 |
| 2004/0145420 A1 | 7/2004 | Knierim et al. |
| 2005/0185749 A1 | 8/2005 | Convent et al. |
| 2005/0186920 A1 | 8/2005 | Staszewski et al. |
| 2005/0280474 A1* | 12/2005 | Roppongi ................. 331/16 |
| 2007/0096799 A1* | 5/2007 | Marais ..................... 327/557 |
| 2007/0188204 A1* | 8/2007 | Savoj ....................... 327/156 |
| 2008/0129389 A1* | 6/2008 | Chien et al. ............... 331/16 |
| 2008/0315963 A1* | 12/2008 | Huang ....................... 331/74 |
| 2011/0234269 A1* | 9/2011 | Yu ............................. 327/155 |

OTHER PUBLICATIONS

Thomas A. D. Riley, "Techniques for In-Band Phase Noise Reduction in Delta Sigma Synthesizers", vol. 50, No. 11, Nov. 2003, IEEE Transactions on Circuits and Systems-II: Analog and Digital Signal Processing, pp. 794-803.

* cited by examiner

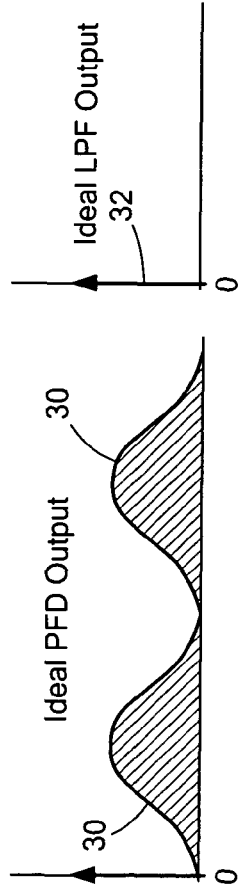
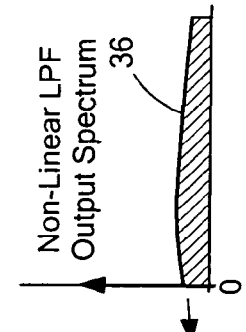
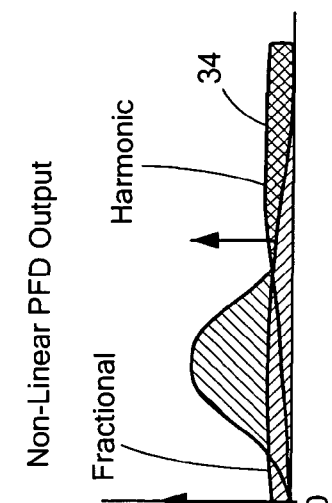
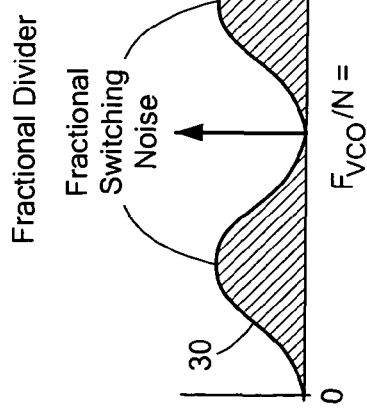
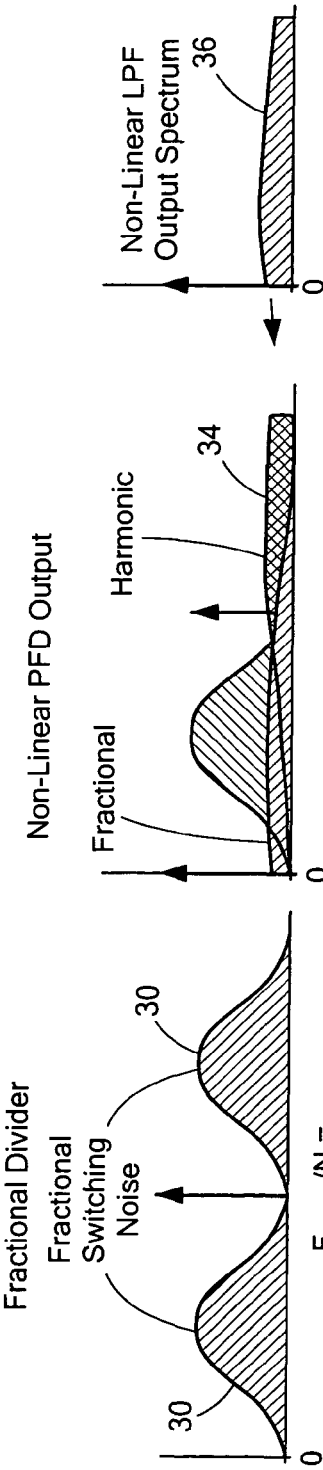

FRACTIONAL-N FREQUENCY SYNTHESIZER HAVING REDUCED FRACTIONAL SWITCHING NOISE

RELATED APPLICATIONS

This application claims benefit of and priority to U.S. Provisional Application Ser. No. 61/212,398 filed Apr. 10, 2009 under 35 U.S.C. §§119, 120, 363, 365, and 37 C.F.R. §1.55 and §1.78 incorporated herein by this reference.

FIELD OF THE INVENTION

This invention relates to fractional-N synthesizers.

BACKGROUND OF THE INVENTION

Frequency synthesizers are used in virtually all wireless devices to create the fundamental frequency at which the wireless device operates. One type of frequency synthesizer is a fractional synthesizer. Many approaches to fractional synthesizers have been developed. A conventional fractional-N synthesizer is disclosed in U.S. Pat. No. 4,965,531. The fractional-N synthesizer of the '531 patent includes a phase frequency detector (PFD), a charge pump, a loop filter, a voltage controlled oscillator (VCO), a reference source, a fractional divider and a sigma delta modulator. The sigma delta modulator generates a sequence of integer numbers which control the divider and, on average, produces the fractional division of the VCO output signal to the PFD.

A problem with typical fractional-N synthesizers such as the synthesizer of the '521 patent is that the modulator creates high energy in fractional switching noise which peaks at one half the rate of the reference frequency provided to the phase detector.

If the frequency divider, phase detector and charge pump were ideal then the folding in the sampling process would fold the null at the PFD sample rate back on to the desired signal and no problem would result. The large fractional noise component would not fold onto the desired signal near zero.

If, however, non-linearities exist in the fractional divider, the phase detector or the charge pump, then harmonic content of the fractional noise may extend into the signal area at the PFD sample rate and would fold into the pass band of the output of the phase detector and charge pump. This is a major problem in fractional-N synthesizers and is a fundamental reason why the fractional-N synthesizer has higher noise than an integer N synthesizer.

Any non-linearity in the phase detector or charge pump in the fractional-N synthesizer will increase the noise floor of the synthesizer. It is known that a faster comparison rate at the phase detector will result in a lower noise integer synthesizer, but a faster comparison rate is problematic in a fractional synthesizer as the increase in speed of the comparison stresses the linearity of the phase detector. Also it is known that larger charge pump devices can lower the thermal noise contribution and 1/f noise contribution of the phase detector, but the larger devices have a difficult time to switch fast and have linearity problems in fractional synthesizers.

It is also known that unintended delay modulation in a fractional divider can cause unwanted noise and spurious. Although this is typically solved by retiming the leading edge of the fractional divider output to be fully synchronous with the input VCO phase for all divider settings, the fundamental signal may still suffer from amplitude modulation (AM).

There are many patents that attempt to address various issues related to problems with the spurious and phase noise of fractional synthesizers. U.S. Pat. No. 6,515,525 attempts to solve the problem with a complex error correction technique.

U.S. Pat. No. 5,055,800 discloses a fractional-N synthesizer that uses a complex multiplier, M, in the feedback loop to increase the fractional value to N/M. The synthesizer of the '800 patent filters the output of the multiplier with a band pass filter but ignores that the multiplier itself undesirably creates non-linearities which may cause harmonics of the fractional modulation spectra to fall in the low-noise regions near the desired signal. All of these references are incorporated herein by this reference.

SUMMARY OF THE INVENTION

In accordance with one aspect of the subject invention, an improved fractional-N frequency synthesizer is provided which, in one specific version, reduces fractional switching noise and spurious signals more effectively than the prior art.

The invention results from the realization that an improved fractional-N frequency synthesizer can reduce fractional switching noise and spurious signals by including a fractional divider that provides synchronous leading and trailing edges for the values of the divider output. The invention also results from the realization that an improved fractional-N frequency synthesizer can reduce fractional switching noise and spurious signals by including a fractional divider that provides synchronous leading and trailing edges for all values of the divider output signal.

This invention features a fractional-N frequency synthesizer having reduced fractional switching noise and spurious signals, the synthesizer including a voltage controlled oscillator for providing an output signal. A fractional-N divider is responsive to the voltage controlled oscillator for providing a divided output signal having fractional switching noise. A band pass filter is responsive to the fractional-N divider for reducing the fractional switching noise and non-linearities that result in spurious signals. A phase detector is responsive to a reference signal and the band pass filter for providing a control signal representative of the phase difference between the reference signal and the signal from the band pass filter. A loop filter is responsive to the phase detector for filtering the control signal to control the voltage controlled oscillator, the output of the loop filter having reduced fractional switching noise and spurious signals.

In one embodiment, the synthesizer may include a charge pump responsive to the phase detector for providing an output signal to the loop filter. The fractional-N divider may include a divider and a modulator for generating a sequence of integer numbers to control the divider. The modulator may be a Sigma-Delta modulator. The loop filter may be a low pass filter. The divider may be integrated with the band pass filter and the phase detector on a silicon integrated circuit. The divider, the band pass filter and the phase detector may each include a separate power supply isolated from each other. The band pass filter may be programmable to allow a user to select a frequency of reference. The band pass filter may be a low noise active filter. The band pass filter may be a passive filter that includes one or more switches. The band pass filter may include a variable tracking filter. The synthesizer may include a sine to square wave conversion circuit coupled between the band pass filter and the phase detector. The center frequency of the band pass filter may be approximately at the frequency of the reference signal.

This invention also features a fractional-N frequency synthesizer having reduced fractional switching noise and spurious signals, the synthesizer including a voltage controlled oscillator for providing an output signal. A fractional-N divider may include a divider responsive to the voltage controlled oscillator and a modulator for generating a sequence of integer numbers to control the divider, the fractional-N divider providing a divided output signal having fractional switching noise. A band pass filter is responsive to the divider for reducing the fractional switching noise and non-linearities that result in spurious signals. A phase detector is responsive to a reference signal and the band pass filter for providing a control signal representative of the phase difference between the reference signal and the signal from the band pass filter. A charge pump is responsive to the phase detector for providing control signals to the loop filter. A loop filter is responsive to the phase detector for filtering the control signal to control the voltage controlled oscillator, the output of the loop filter having reduced fractional switching noise and spurious signals.

In one embodiment, the modulator may be a Sigma-Delta modulator.

This invention also features a fractional-N frequency synthesizer having reduced fractional switching noise and spurious signals, the synthesizer including a voltage controlled oscillator for providing an output signal. A fractional-N divider is responsive to the voltage controlled oscillator for providing a divided output signal including synchronous leading and trailing edges, the divided output signal having fractional switching noise. A band pass filter is responsive to the fractional-N divider for reducing the fractional switching noise and non-linearities that result in spurious signals. A phase detector is responsive to a reference signal and the band pass filter for providing a control signal representative of the phase difference between the reference signal and the signal from the band pass filter. A loop filter is responsive to the phase detector for filtering the control signal to control the voltage controlled oscillator, the output of the loop filter having reduced fractional switching noise and spurious signals.

In one embodiment, the divided output signal of the fractional-N divider may include the removal of modulus delay modulation. The divided output signal of the fractional-N divider may be synchronized with a predetermined number of voltage controlled oscillator cycles for each of the division ratios of the fractional-N divider. The charge pump may be responsive to the phase detector for providing an output signal to the loop filter. The charge pump may be responsive to the phase detector for providing an output signal to the loop filter. The fractional-N divider may include a divider and a modulator for generating a sequence of integer numbers to control the divider. The modulator may be a Sigma-Delta modulator. The loop filter may be a low pass filter. The divider may be integrated with the band pass filter and the phase detector on a silicon integrated circuit. The divider, the band pass filter and the phase detector may each include a separate power supply isolated from each other. The band pass filter may be programmable to allow a user to select a frequency of reference. The band pass filter may be a low noise active filter. The band pass filter may be a passive filter that includes one or more switches. The band pass filter may include a variable tracking filter. The sine to square wave conversion circuit may be coupled between the band pass filter and the phase detector. The center frequency of the band pass filter may be approximately at the frequency of the reference signal.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which:

FIGS. 2A, 2B, and 2C are graphs showing the output from an ideal fractional divider, phase frequency detector, and low pass filter, respectively, of the fractional-N frequency synthesizer of FIG. 1;

FIGS. 3A, 3B, and 3C show the output from typical, non-ideal fractional divider, phase frequency detector, and low pass filter, respectively, of the fractional-N frequency synthesizer of FIG. 1;

DETAILED DESCRIPTION OF THE INVENTION

Figure 1:
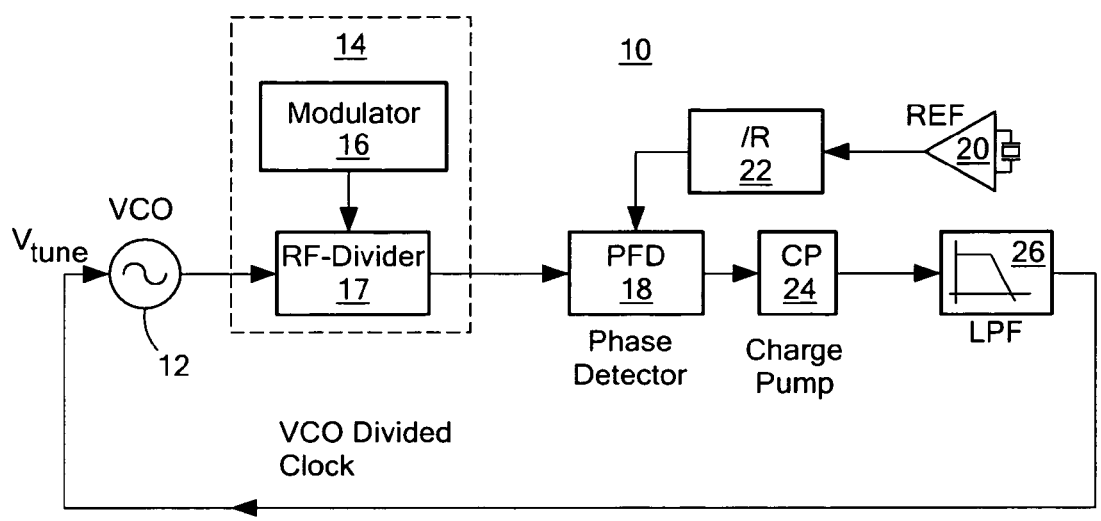
FIG. 1 is a schematic diagram of a prior art fractional-N frequency synthesizer.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a conventional prior art fractional-N frequency synthesizer as disclosed in U.S. Pat. No. 4,965,531. The fractional-N synthesizer 10 of the '531 patent includes a voltage controlled oscillator 12 that provides an output signal which may be used as the output signal from the fractional-N frequency synthesizer. A fractional-N divider 17 is responsive to VCO 12, and to the fractional modulator, 16, and provides a divided output signal which includes fractional switching noise and non-linearities as described above. Fractional-N divider 14 may include a divider 17 and a modulator 16 which generates a sequence of integer numbers to control the divider. Modulator 16 is preferably a sigma-delta modulator. A phase detector 18, also called a phase frequency detector, is responsive to fractional-N divider 14 and a reference signal which may be provided by reference amplifier 20 and divider 22. Phase detector 18 provides a control signal representative of the phase difference between the reference signal and the signal from fractional-N divider 14. A charge pump 24 or voltage amplifier provides a phase-to-current or phase-to-voltage conversion and provides an output signal to loop filter 26. Loop filter 26 is responsive to charge pump 24 and phase detector 18 for providing an output signal to control voltage controlled oscillator 12.

In operation, modulator 16 generates a sequence of integer numbers which control divider 17 and on average produces the fractional division of the VCO output signal to the PFD. As described above, however, the problem with the conventional fractional-N frequency synthesizer is that the modulator creates high energy in fractional switching noise 30 and non-linearities, FIG. 2A. The fractional switching noise 30 peaks at one half the rate of the reference path at the phase detector.

If phase detector 18 and charge pump 24 were ideal, then the folding in the sampling process would fold the null at the phase frequency detector sample rate back on to the desired signal as shown in FIG. 2B, and no problem would result in the output signal 32 of loop filter 26 as shown in FIG. 2C. The large fractional noise component would not fold onto the desired signal near zero.

If, however, non-linearities exist in the phase detector and charge pump as they typically do, then harmonic content 34 of the fractional noise may extend into the signal area at the PFD sample rate and would fold into the pass band of the output signal 36 of the loop filter 26 as shown in FIGS. 3A-C. This is a major problem in fractional-N synthesizers and is a fundamental reason why the fractional-N synthesizer has higher noise than an integer N synthesizer.

Figure 4:
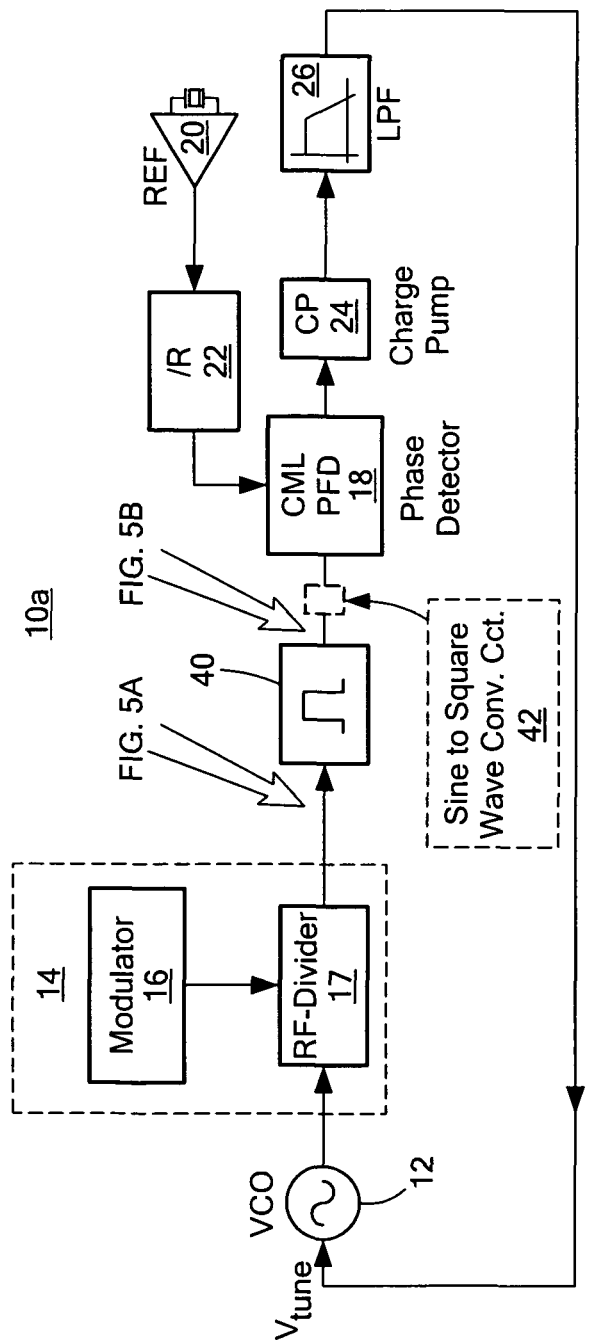
FIG. 4 is a schematic diagram of the fractional-N frequency synthesizer in accordance with an embodiment of the subject invention.

To overcome the disadvantages associated with the prior art, fractional-N synthesizer 10a, FIG. 4, includes a band pass filter 40 between divider 14 and the phase detector 18. The center frequency of band pass filter 40 is preferably at approximately the reference frequency of the reference signal provided to the phase detector and has a bandwidth wide enough to not affect the loop filter passband. The band pass filter 40 preferably removes the majority of the fractional switching noise. It is not necessary to remove all of the fractional switching noise, since the improvement in third order folding products is roughly double in dB the reduction in the total fractional noise power into the phase detector. Band pass filter 40 allows the phase detector to operate similarly to that of a phase detector in an integer synthesizer. Also, the use of band pass filter 40 avoids the need for a very high linearity phase detector and charge pump.

Typically, the linearity problem in conventional fractional synthesizers is so great that the phase detector 18 and charge pump 24 are operated with a phase offset to avoid charge pump 24 crossing the zero phase point. This keeps charge pump 24 operating with only one charge pump, for example UP only, and reduces linearity problems by avoiding switching from UP to DN (down). This is itself problematic as the phase offset results in DC currents flowing constantly into loop filter 26 which increase reference sidebands, increase thermal noise, increase flicker noise and makes phase detector 18 vulnerable to coupling from VCO 12 which increases fractional boundary spurious levels.

All of these problems are greatly reduced or eliminated completely by operating the fractional synthesizer with band pass filter 40 before the phase detector 18. Phase detector 18 with band pass filter 40 gets a nearly sinusoidal input from the VCO path which typically allows it to operate without offsets, reduces thermal noise, reduces flicker noise, reduces VCO coupling and enables the use of smaller devices which can run faster and yet produce lower noise.

Figure 5A:
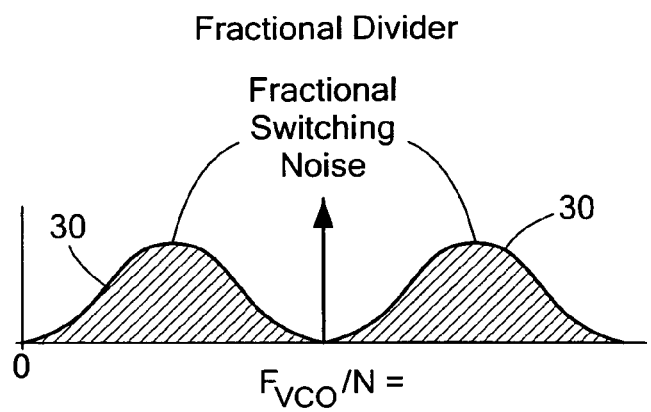
FIGS. 5A, 5B, and 5C are graphs showing the output from the fractional divider, phase frequency detector, and low pass filter, respectively, of the fractional-N frequency synthesizer of FIG. 4.
Figure 5B:
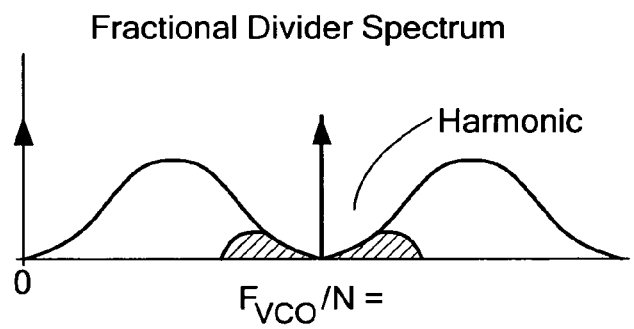
Figure 5C:
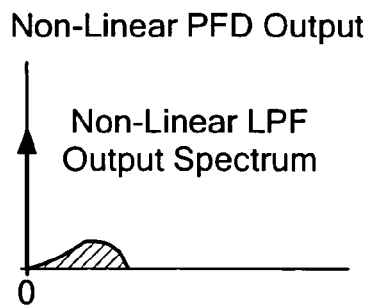
Figure 6:
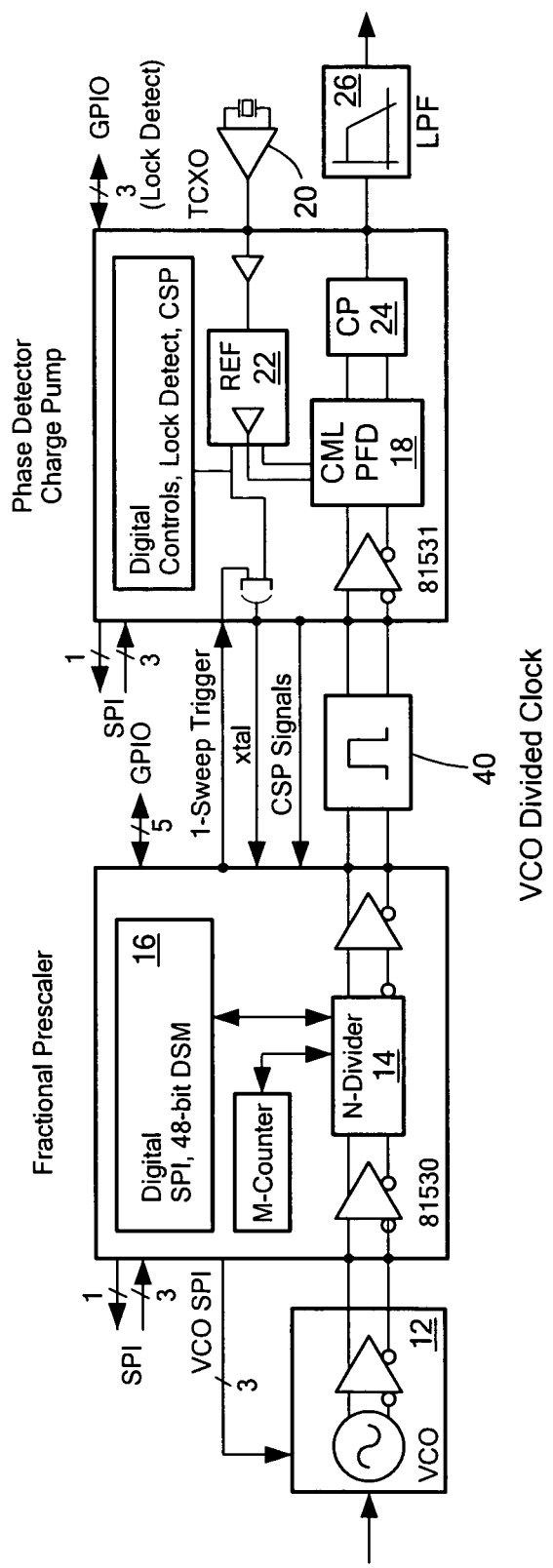
FIG. 6 is a block diagram of one embodiment of the fractional-N frequency synthesizer of FIG. 4.

One embodiment of the subject invention is shown in FIG. 5. This embodiment separates phase detector 18 from the VCO 12 and the input stages of the RF divider 14. This avoids the possibility that spurious signals are caused by the substrate coupling directly from VCO 12 to phase detector 18. The band pass filter 40, divider 14 and phase detector 18 may be integrated on the same silicon IC, but it is preferable in this case that the power supplies for the VCO, divider, and phase detector are isolated.

A potential problem with the use of band pass filter 40 is that, after band pass filtering, the fractionally divided VCO signal is reduced to a near sinusoid, with sinusoidal rise times. The slow rise times can cause additional noise to enter into the phase detector if not addressed with a low noise sine to square wave conversion circuit 42. Such a circuit may be similar to one typically implemented in the low noise sinusoidal reference path circuits.

Band pass filter 40 may also be programmable to allow the user to choose the frequency of the reference for their application. Such a band pass filter could be implemented in integrated form, using many possible techniques such as low noise active filters, passive filters with switches or other variable tracking filter techniques.

Synthesizer 10a typically allows the full frequency flexibility of a fractional synthesizer with the low noise performance of an integer synthesizer with a high reference frequency. Also the integer boundary spurious sidebands common in both the fractional synthesizers and in integer synthesizers that use a low comparison frequency divided down from a higher frequency crystal reference, are virtually eliminated. Synthesizer 10a may be used in virtually any radio frequency application that requires a low noise synthesizer.

As described in the Background above, it is also well known in fractional synthesizers that the dynamic modulation of the fractional division must not inadvertently change the delay of the division process. For this reason it is common practice to eliminate the undesired delay modulation in the fractional divider output stream by reclocking, or retiming, the leading edge of the fractional divider output signal with a timing signal running at the rate of the VCO. This is commonly done with a very high speed flip flop running at the VCO rate. This type of circuit typically only cleans up the leading edge of the fractional divider data incident upon the phase detector. Normally the trailing edge of the fractional divider data is not well controlled and is normally unimportant to the phase detector.

If, however, the output pulse from divider 17 has a clean leading edge, but has some jitter on its trailing edge, then the fundamental signal will suffer from a small amount of amplitude modulation (AM). The undesired AM modulation will cause AM to phase modulation (PM) conversion not only in divider 17, but also in phase detector 18 if band pass filter 40 is used.

Figure 7:
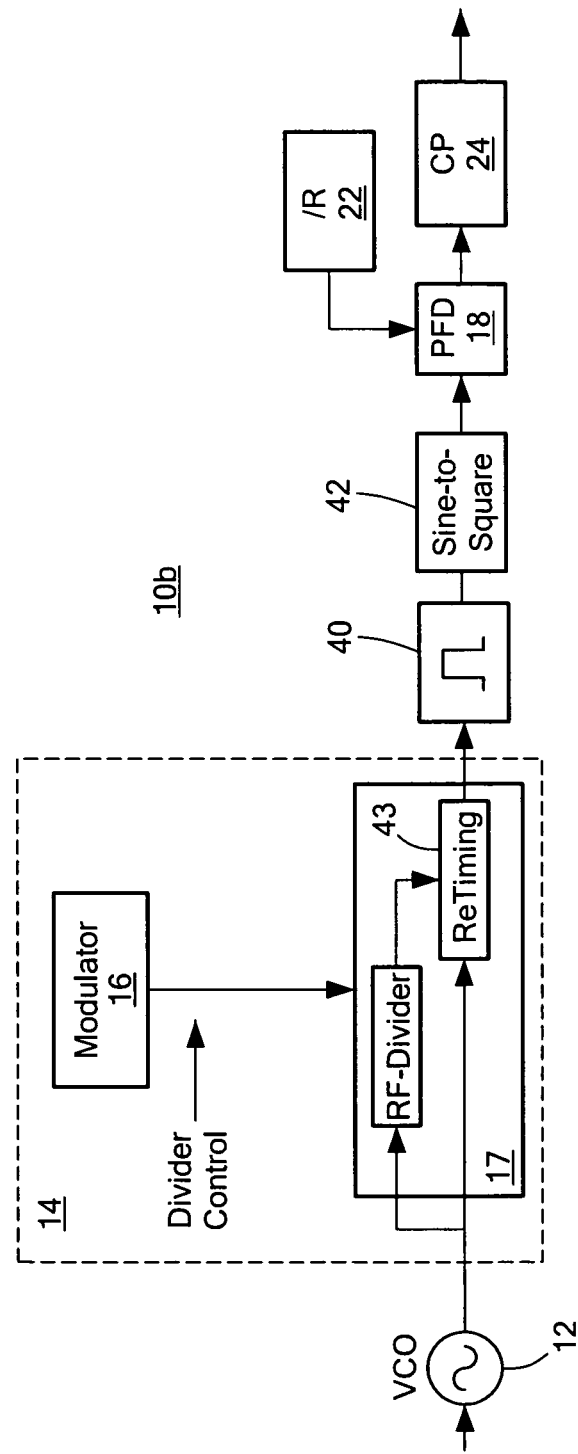
FIG. 7 is a schematic diagram of another embodiment of the fractional-N frequency synthesizer of FIG. 1 which includes a retiming circuit.
Figure 8:
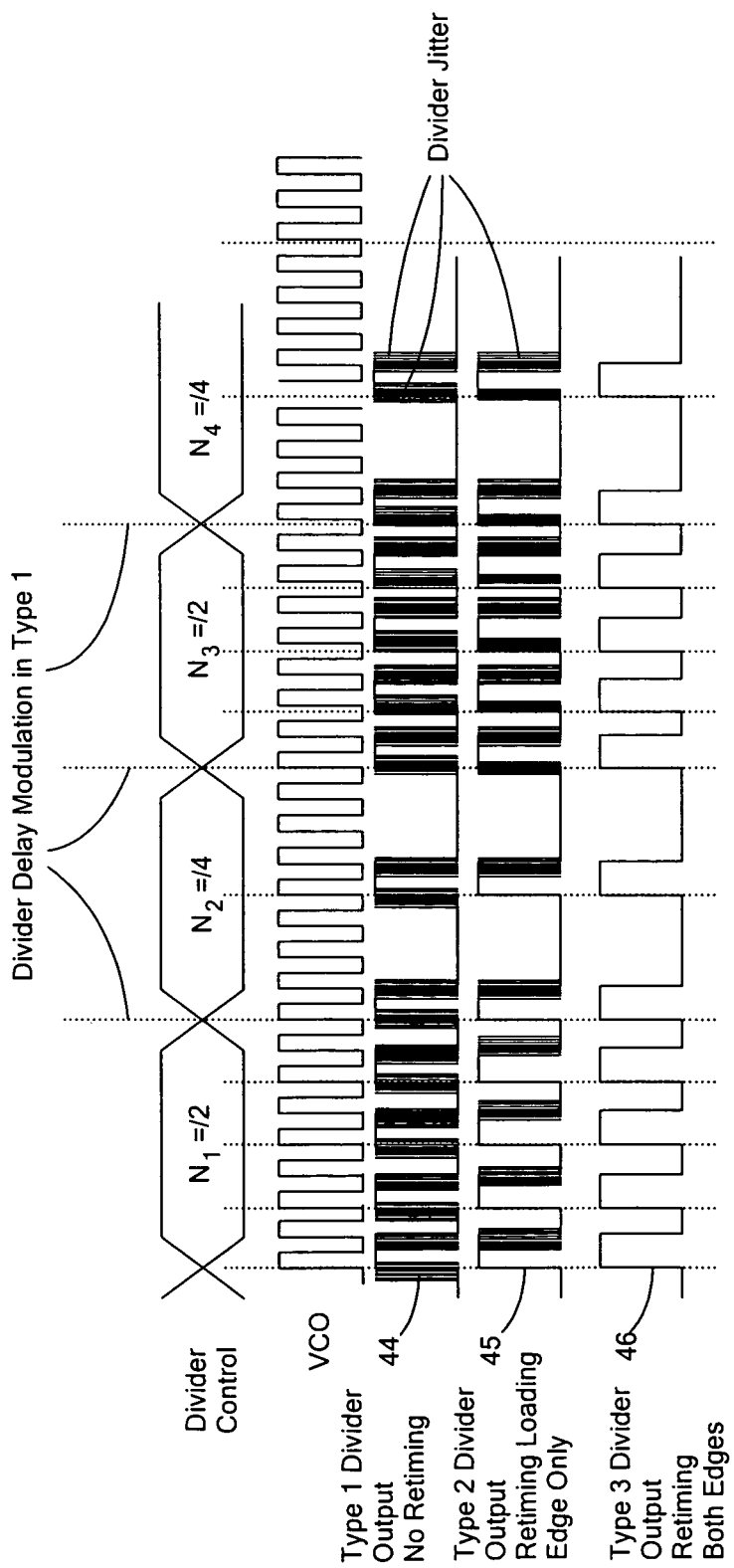
FIG. 8 is a timing diagram showing the waveforms for three different fractional divider types.

To reduce the AM to PM conversion, fractional-N divider 14b, FIG. 7, includes divider 17, a retiming circuit 43, and modulator 16 which generates a sequence of integer numbers to control the divider. Modulator 16 is preferably a sigma-delta modulator. Retiming circuit 43 is preferably a type 3 retiming circuit that provides a divided output signal 46, FIG. 8, having both synchronous leading and trailing edges to reduce the AM to PM conversion. This is contrast to a type 2 divided output signal 45 which only includes synchronous leading edges or a type 1 divided output signal 44 which does not include any retiming. Although the use of a type 3 retiming circuit is preferable, it is not necessary for all embodiments of the subject invention.

Figure 9:
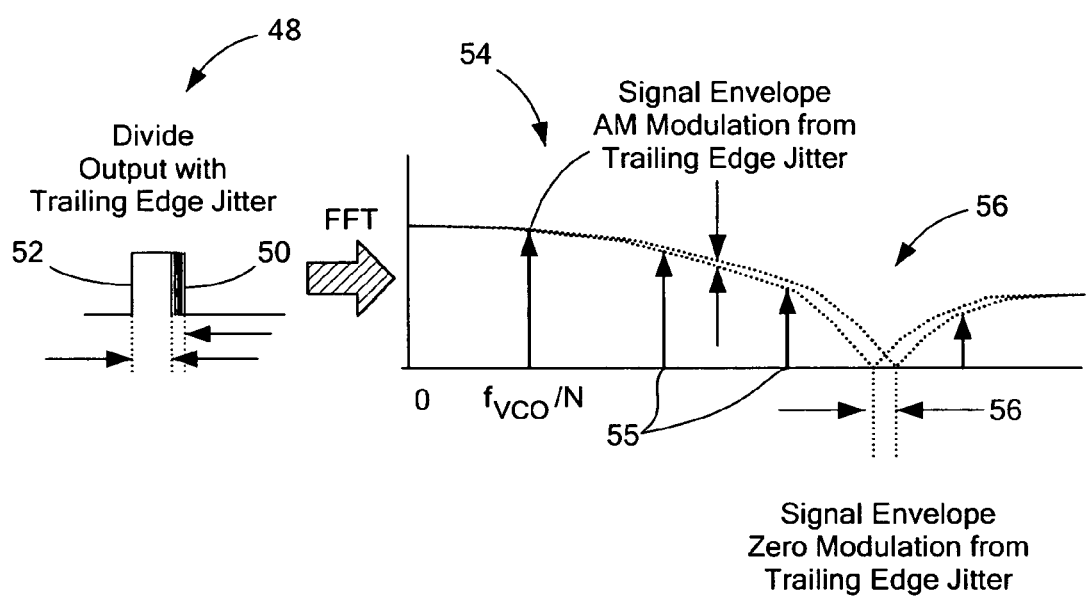
FIG. 9 is a schematic diagram of an individual pulse from a conventional type 2 factional divider and the resulting AM-PM spectrum.

To understand the benefit of a type 3 retiming circuit, it helps to look at the Fourier transform of a pulse signal 48, FIG. 9, such as the output of the fractional divider having a leading edge 50 and a trailing edge 52. The output pulse has a spectrum 54 consisting of a series of harmonics 55 of the fundamental, all of which have an amplitude set by the first zero of the sinx/x envelope 56 of the spectrum. The frequency location of the first zero is set by the inverse of the pulse width output. Hence the power in the fundamental is affected slightly by the location of the sinx/x zero.

If the divider output pulse has a clean leading edge, but has some jitter on its trailing edge, then the frequency of the zero in the sinx/x envelope will move as shown at 58, and the fundamental signal will suffer from a small amount of AM modulation. The undesired AM modulation will cause AM to PM conversion both in divider 17 and in phase detector 18 after band pass filter 40. The use of a type 3 retiming circuit 43 will reduce this AM to PM conversion. Also, the divided output signal of the fractional-N divider is preferably synchronized with a predetermined number of voltage controlled oscillator cycles for each of the division ratios of the fractional-N divider.

Further the inherent duty cycle modulation of the m/N(t) fractional divider, varies versus time if m is fixed and N(t) changes under modulator control. After removal of the fractional noise in bandpass filter 40, the energy in the fundamental will be subject to AM modulation. The sine to square wave converter 42, FIG. 7, may also serve to reduce this AM modulation and may be a low noise, low AM-to-PM buffer amplifier.

Generally, wider band pass filtering, or even simple low pass filtering schemes, will reduce but not eliminate all of the fractional spurious components. Any amount of reduction in the fractional modulation prior to the input to the phase detector will reduce non-linear effects in the phase detector and will improve performance proportionally.

Band pass filter 40 is preferably not made so narrow as to distort unnecessarily the normal phase locked loop feedback. This is not a limitation of the invention as significant improvement may be achieved with reasonably wide band pass filtering. The subject invention is easier to implement if the reference frequency is higher. This fact does not limit the generality of the concept to be applied, in theory, at any reference frequency.

If the band of loop filter 26 is excessively wide relative to the reference frequency, it will not be able to benefit as much from this invention as one which band is smaller proportionally to the reference sampling rate.

The above description related to spectral noise folding in the phase detector and charge pump has focused on the effects of spectral noise folding for simplicity of discussion. The spectrum of a fractional modulator far from the carrier is however not a homogenous white spectrum. It also contains spurious spectral tones. The subject invention may also prevent or reduce the folding of spurious spectral tones, thus improving the spurious performance of the fractional synthesizer as well as its phase noise performance.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A fractional-N frequency synthesizer having reduced fractional switching noise and spurious signals, the synthesizer comprising:
    a voltage controlled oscillator for providing an output signal;
    a fractional-N divider responsive to the voltage controlled oscillator for providing a divided output signal having fractional switching noise;
    a band pass filter having a center frequency at approximately a frequency of a reference signal and responsive to the fractional-N divider for reducing the fractional switching noise and non-linearities of the fractional-N divider that result in spurious signals;
    a phase detector responsive to the reference signal and the band pass filter for providing a control signal representative of the phase difference between the reference signal and the signal from the band pass filter; and
    a loop filter responsive to the phase detector for filtering the control signal to control the voltage controlled oscillator, the output of the loop filter having reduced fractional switching noise and spurious signals.

2. The synthesizer of claim 1 further including a charge pump responsive to the phase detector for providing an output signal to the loop filter.

3. The synthesizer of claim 1 in which the fractional-N divider includes a divider and a modulator for generating a sequence of integer numbers to control the divider.

4. The synthesizer of claim 3 in which the modulator is a Sigma-Delta modulator.

5. The synthesizer of claim 1 in which the loop filter is a low pass filter.

6. The synthesizer of claim 1 in which the divider is integrated with the band pass filter and the phase detector on a silicon integrated circuit.

7. The synthesizer of claim 6 in which the divider, the band pass filter and the phase detector each include a separate power supply isolated from each other.

8. The synthesizer of claim 1 in which the band pass filter is programmable to allow a user to select a frequency of reference.

9. The synthesizer of claim 8 in which the band pass filter is a low noise active filter.

10. The synthesizer of claim 8 in which the band pass filter is a passive filter that includes one or more switches.

11. The synthesizer of claim 8 in which the band pass filter includes a variable tracking filter.

12. The synthesizer of claim 1 further including a sine to square wave conversion circuit coupled between the band pass filter and the phase detector.

13. A fractional-N frequency synthesizer having reduced fractional switching noise and spurious signals, the synthesizer comprising:
    a voltage controlled oscillator for providing an output signal;
    a fractional-N divider including a divider responsive to the voltage controlled oscillator and a modulator for generating a sequence of integer numbers to control the divider, the fractional-N divider providing a divided output signal having fractional switching noise;

a programmable band pass filter responsive to the divider for allowing a user to select a frequency of a reference signal to reduce the fractional switching noise and non-linearities of the fractional-N divider that result in spurious signals;

a phase detector responsive to the reference signal and the band pass filter for providing a control signal representative of the phase difference between the reference signal and the signal from the band pass filter;

a charge pump responsive to the phase detector for providing control signals to the loop filter; and a loop filter responsive to the phase detector for filtering the control signal to control the voltage controlled oscillator, the output of the loop filter having reduced fractional switching noise and spurious signals.

14. The synthesizer of claim 13 in which the modulator is a Sigma-Delta modulator.

15. A fractional-N frequency synthesizer having reduced fractional switching noise and spurious signals, the synthesizer comprising:

a voltage controlled oscillator for providing an output signal;

a fractional-N divider including a divider and a retiming circuit responsive to the voltage controlled oscillator for providing a divided output signal having synchronous leading and trailing edges, the divided output signal having fractional switching noise;

a band pass filter having a center frequency at approximately a frequency of a reference signal and responsive to the fractional-N divider reducing the fractional switching noise and non-linearities of the fractional-N divider that result in spurious signals;

a phase detector responsive to the reference signal and the band pass filter for providing a control signal representative of the phase difference between the reference signal and the signal from the band pass filter; and a loop filter responsive to the phase detector for filtering the control signal to control the voltage controlled oscillator, the output of the loop filter having reduced fractional switching noise and spurious signals.

16. The synthesizer of claim 15 in which the retiming circuit removes modulus delay modulation from the divided output signal.

17. The synthesizer of claim 16 in which the retiming circuit further synchronizes the divided output signal with a predetermined number of voltage controlled oscillator cycles for each of the division ratios of the fractional-N divider.

18. The synthesizer of claim 15 further including a charge pump responsive to the phase detector for providing an output signal to the loop filter.

19. The synthesizer of claim 15 in which the fractional-N divider includes a modulator for generating a sequence of integer numbers to control the divider.

20. The synthesizer of claim 19 in which the modulator is a Sigma-Delta modulator.

21. The synthesizer of claim 15 in which the loop filter is a low pass filter.

22. The synthesizer of claim 15 in which the divider is integrated with the band pass filter and the phase detector on a silicon integrated circuit.

23. The synthesizer of claim 22 in which the divider, the band pass filter and the phase detector each include a separate power supply isolated from each other.

24. The synthesizer of claim 15 in which the band pass filter is programmable to allow a user to select a frequency of reference.

25. The synthesizer of claim 24 in which the band pass filter is a low noise active filter.

26. The synthesizer of claim 24 in which the band pass filter is a passive filter that includes one or more switches for bypassing the filter.

27. The synthesizer of claim 24 in which the band pass filter includes a variable tracking filter.

28. The synthesizer of claim 15 further including a sine to square wave conversion circuit coupled between the band pass filter and the phase detector.

* * * * *